(12) United States Patent  
Cheng et al.

(10) Patent No.: US 11,901,923 B2
(45) Date of Patent: Feb. 13, 2024

(54) SIGNAL TRANSMITTER

(71) Applicant: Huawei Technologies Co., Ltd., Shenzhen (CN)

(72) Inventors: Qianfu Cheng, Chengdu (CN); Hua Cai, Chengdu (CN); Guangjian Wang, Chengdu (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 58 days.

(21) Appl. No.: 17/836,675

(22) Filed: Jun. 9, 2022

(65) Prior Publication Data

US 2022/0302937 A1  Sep. 22, 2022

Related U.S. Application Data

(63) Continuation of application No. PCT/CN2020/134927, filed on Dec. 9, 2020.

(30) Foreign Application Priority Data

Dec. 10, 2019 (CN) .......................... 201911261733.X

(51) Int. Cl.
*H04B 1/04* (2006.01)
*H04B 7/06* (2006.01)

(52) U.S. Cl.
CPC ................. *H04B 1/04* (2013.01); *H04B 7/06* (2013.01); *H04B 2001/045* (2013.01)

(58) Field of Classification Search
CPC .......... H04B 1/02; H04B 1/04; H04B 1/0483; H04B 7/06; H04B 2001/0408; H04B 2001/045

(Continued)

(56) References Cited

U.S. PATENT DOCUMENTS

| 5,936,592 A | 8/1999 | Ramanujam et al. |
| 6,397,039 B1 | 5/2002 | Butte et al. |

(Continued)

FOREIGN PATENT DOCUMENTS

| CN | 101729079 A | 6/2010 |
| CN | 102683141 A | 9/2012 |

(Continued)

OTHER PUBLICATIONS

Birafane, A. et al., "On the Linearity and Efficiency of Outphasing Microwave Amplifiers," IEEE Transactions on Microwave Theory and Techniques, vol. 52, No. 7, Jul. 2004, 7 pages.
Choffrut, A., "Traveling Wave Tube-Based LINC Transmitters," IEEE Transactions on Electron Devices, vol. 50, No. 5, May 2003, 3 pages.
Coffrut, A. et al., "Traveling Wave Tube-Based LINC Transmitters," IEEE Transactions on Electron Devices, vol. 50, No. 5, May 2003, 3 pages.

(Continued)

*Primary Examiner* — Young T. Tse
(74) *Attorney, Agent, or Firm* — Slater Matsil, LLP

(57) ABSTRACT

A signal transmitter is provided. The signal transmitter includes a signal splitting module, including M output interfaces, where the signal splitting module is configured to split a signal into N sub-signals, and output the N sub-signals through N of the M output interfaces, where M and N are integers, M≥2, N≥1, and M≥N, an integrated array traveling-wave tube amplifier, including M radio frequency channels, where the M channels one-to-one correspond to the M output interfaces, each channel is configured to perform power amplification on a sub-signal that is output from a corresponding output interface, and each channel is openable and closeable, a power supply module, configured to supply power to the integrated array traveling-wave tube amplifier, and at least one transmit antenna, configured to send a signal obtained through power amplification.

12 Claims, 5 Drawing Sheets

(58) Field of Classification Search
USPC ....... 375/295–297, 299; 455/101–103, 114.3
See application file for complete search history.

(56) References Cited

U.S. PATENT DOCUMENTS

| | | | |
|---|---|---|---|
| 10,447,219 B2 | 10/2019 | Wu et al. | |
| 2004/0185805 A1* | 9/2004 | Kim | H04B 1/0483 |
| | | | 455/114.3 |
| 2013/0088383 A1* | 4/2013 | Forstner | G01S 7/02 |
| | | | 342/372 |
| 2014/0064341 A1* | 3/2014 | Johansson | H04B 1/0067 |
| | | | 375/219 |
| 2015/0256134 A1 | 9/2015 | Arcidiacono et al. | |
| 2017/0026006 A1 | 1/2017 | Roukos et al. | |
| 2018/0183397 A1 | 6/2018 | Wu et al. | |

FOREIGN PATENT DOCUMENTS

| | | |
|---|---|---|
| CN | 105049108 A | 11/2015 |
| JP | 2000156659 A | 6/2000 |

OTHER PUBLICATIONS

Conradi, C.P. et al., "Evaluation of a Lossless Combiner in a LINC Transmitter," Proceedings of the 1999 IEEE Canadian Conference on Electrical and Computer Engineering, Shaw Conference Center, Edmonton, Alberta, Canada, May 9-12, 1999, 6 pages.

Guerreiro, J. et al., "A Multi-branch Linear Amplification with Nonlinear Components Technique, " IEEE Military Communications Conference (MILCOM), IEEE, 2018, 5 pages.

Hu, Y. et al., "Latest Experiment Results of Integrated TWT," 2015 IEEE International Vacuum Electronics Conference (IVEC), IEEE, 2015, 2 pages.

Zhang, J. et al., "Equivalent Multisector Analytical Method for High-Frequency Characteristics of Integrated Three-Helix TWT," IEEE Transactions on Plasma Science, vol. 46, No. 5, May 2018, 8 pages.

Zhang, Q. et al., "Design and Analysis of Ka-Band MIMO Integrated TWTs," IEEE International Vacuum Electronics Conference (IVEC). IEEE, 2016, 2 pages.

\* cited by examiner

SIGNAL TRANSMITTER

CROSS-REFERENCE TO RELATED APPLICATIONS

This application is a continuation of International Patent Application No. PCT/CN2020/134927, filed on Dec. 9, 2020, which claims priority to Chinese Patent Application No. 201911261733.X, filed on Dec. 10, 2019. The disclosures of the aforementioned applications are hereby incorporated by reference in their entireties.

TECHNICAL FIELD

The present invention relates generally to the field of communications, and in particular to a signal transmitter.

BACKGROUND

A conventional linear amplification using nonlinear components (LINC) amplifier/transmitter that is based on a traveling-wave tube amplifier (TWTA) uses two independent efficient TWTAs to respectively perform power amplification on two sub-signals obtained through splitting. Due to a factor such as a process error, the two power amplifiers differ in performance to a specific degree. Consequently, after two signals obtained through the power amplification are combined into one signal, quality and efficiency of the combined signal are severely reduced. Actually, to improve transmitter performance, calibration compensation needs to be performed on each power amplifier through a feedback calibration channel. Therefore, system complexity is greatly improved. In addition, usually, each traveling-wave tube supports amplification of only one signal. However, the LINC transmitter uses two traveling-wave tubes. Consequently, a transmitter size and weight are doubled, causing a burden to an entire transmitter system. Furthermore, the LINC transmitter supports splitting of only one signal, and cannot support splitting of a plurality of signals and use of signals of a plurality of frequency bands. Therefore, the LINC transmitter is relatively limited in actual use.

Therefore, how to improve practicality and performance of the LINC amplifier/transmitter becomes a problem urgently to be resolved.

SUMMARY

This application provides a signal transmitter, to improve signal splitting flexibility of the transmitter and improve power amplification performance of a system.

According to a first aspect, a signal transmitter is provided. The signal transmitter may include a signal splitting module, including M output interfaces, where the signal splitting module is configured to split a signal into N sub-signals, and output the N sub-signals through N of the M output interfaces, where M and N are integers, M≥2, N≥1, and M≥N, an integrated array traveling-wave tube amplifier, including M radio frequency channels, where the M radio channels one-to-one correspond to the M output interfaces, each radio channel is configured to perform power amplification on a sub-signal that is output from a corresponding output interface, and the radio channel is openable and closeable, a power supply module, configured to supply power to the integrated array traveling-wave tube amplifier, and at least one transmit antenna, configured to send a signal obtained through power amplification.

In the foregoing technical solution, when one signal is split into a maximum of M sub-signals, the signal splitting module may split the signal into the N actually required sub-signals, thereby improving signal splitting flexibility and practicality of the transmitter. In addition, the N sub-signals pass through N radio frequency channels with consistent performance of the integrated array traveling-wave tube, thereby improving a performance indicator of the transmitter.

With reference to the first aspect, in some implementations of the first aspect, the signal splitting module may be further configured to split P signals into N sub-signals, where P is an integer and N≥P≥2.

In the foregoing technical solution, the signal splitting module may also support splitting of two or more signals, thereby improving signal splitting flexibility and practicality of the transmitter.

With reference to the first aspect, in some implementations of the first aspect, the integrated array traveling-wave tube may be further configured to perform power amplification on a plurality of sub-signals of different frequency bands.

In the foregoing technical solution, the integrated array traveling-wave tube may simultaneously perform power amplification on sub-signals that are of a plurality of frequency bands and that are obtained through splitting, thereby improving practicality and efficiency of the signal transmitter.

With reference to the first aspect, in some implementations of the first aspect, a first controller is configured to control opening and closing of each of the M radio frequency channels.

In the foregoing technical solution, the first controller controls opening and closing of the M channels of the integrated array traveling-wave tube, and closes a radio frequency channel that does not need to work, so that power consumption of the signal transmitter can be reduced.

With reference to the first aspect, in some implementations of the first aspect, the first controller is specifically configured to control connection and disconnection between each radio frequency channel and the corresponding output interface.

In the foregoing technical solution, the first controller controls connection and disconnection between the radio frequency channel and the corresponding output interface of the signal splitting module, and closes the radio frequency channel that does not need to work, so that power consumption of the signal transmitter can be reduced.

With reference to the first aspect, in some implementations of the first aspect, the power supply module is configured to supply respective corresponding cathode voltages to the M radio frequency channels, and the first controller is specifically configured to control a supply status between a cathode voltage corresponding to each radio frequency channel and the power supply module.

In the foregoing technical solution, the first controller controls a cathode voltage of the radio frequency channel that does not need to work, to be cut off, so that power consumption of the signal transmitter can be reduced.

With reference to the first aspect, in some implementations of the first aspect, a second controller is configured to control the quantity N of sub-signals that are output by the signal splitting module.

In the foregoing technical solution, the second controller controls a specific quantity of sub-signals obtained through splitting by the signal splitting module, so that signal splitting flexibility and practicality of the signal transmitter can be improved.

With reference to the first aspect, in some implementations of the first aspect, there are M transmit antennas, the M transmit antennas one-to-one correspond to the M radio frequency channels, and each transmit antenna is configured to send a corresponding sub-signal.

In the foregoing technical solution, the transmitter is no longer affected by a limitation of a combining module for a bandwidth, and N sub-signals that are obtained through power amplification by the integrated array traveling-wave tube may be directly transmitted through N of the M antennas, so that an architecture of the transmitter is more suitable for use of a wideband wireless system.

With reference to the first aspect, in some implementations of the first aspect, there is one transmit antenna. The signal transmitter further includes a signal combining module, configured to combine N sub-signals that are obtained through power amplification and that are output from the integrated traveling-wave tube amplifier, and the transmit antenna is specifically configured to transmit a combined signal.

With reference to the first aspect, in some implementations of the first aspect, the signal splitting module is specifically configured to split the signal into the N sub-signals in an analog domain.

In the foregoing technical solution, the signal splitting module converts, into analog signals, the N sub-signals obtained through the splitting, and a drive level required by the integrated array traveling-wave tube is reached.

With reference to the first aspect, in some implementations of the first aspect, the signal splitting module is specifically configured to split the signal into the N sub-signals in a digital domain. The signal transmitter further includes M digital-to-analog converters, where the M digital-to-analog converters one-to-one correspond to the M output interfaces, and each digital-to-analog converter is configured to perform digital-to-analog conversion on a sub-signal that is output from a corresponding output interface.

In the foregoing technical solution, the signal splitting module outputs N digital signals, and N of the M digital-to-analog converters convert the N digital signals into analog signals, to meet a type of a signal entering the radio frequency channel of the integrated array traveling-wave tube for power amplification.

With reference to the first aspect, in some implementations of the first aspect, the signal transmitter further includes M drive amplifiers, where the M drive amplifiers one-to-one correspond to the M output interfaces, the M drive amplifiers one-to-one correspond to the M channels, each drive amplifier is configured to perform power amplification on a sub-signal that is output from a corresponding output interface, so that amplified power meets an input power requirement of a corresponding radio frequency channel of the integrated array traveling-wave tube.

In the foregoing technical solution, N of the M drive amplifiers perform power amplification on the N sub-signals, so that the N sub-signals meet input power requirements for entering the radio frequency channels of the integrated array traveling-wave tubes.

According to a second aspect, a communication device is provided. The communication device includes the signal transmitter in any one of the first aspect and the various implementations of the first aspect.

According to a third aspect, a communication system is provided. The communication system includes the communication device in the second aspect.

DETAILED DESCRIPTION OF ILLUSTRATIVE EMBODIMENTS

A plurality of embodiments in this application are now described with reference to the accompanying drawings, and same elements in this specification are indicated by using same reference signs. In the following description, for ease of explanation, many specific details are provided to facilitate comprehensive understanding of one or more embodiments. However, it is clear that embodiments may either not be implemented by using these specific details. In other examples, a well-known structure and device are shown in a form of block diagrams, to conveniently describe one or more embodiments.

Technical solutions in embodiments of this application may be applied to various communication systems, for example, a long term evolution (LTE) system, an LTE frequency division duplex (FDD) system, an LTE time division duplex (TDD) system, a universal mobile telecommunications system (UMTS), a worldwide interoperability for microwave access (WiMAX) communication system, a satellite communication system, a spatial communication system, a 5th generation (5G) mobile communication system, a new radio access technology (NR), or a future communication system, for example, a next-generation communication technology 6G.

Figure 1:
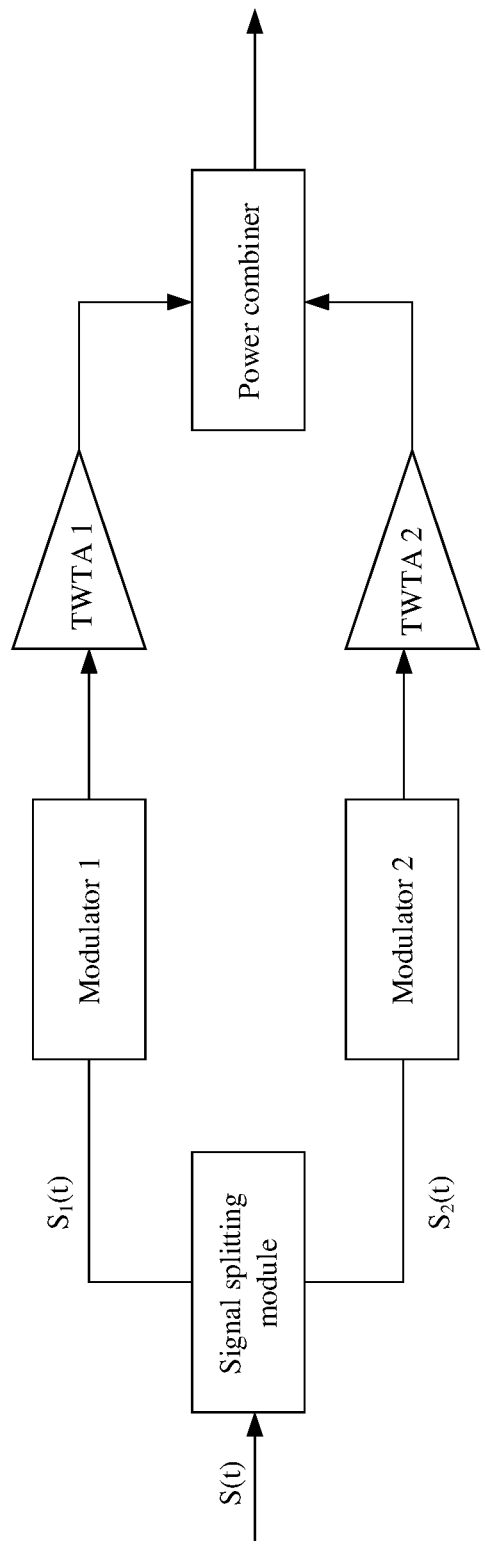
FIG. 1 is a schematic block diagram of a structure of an LINC power amplifier/transmitter that is based on a TWTA.

To facilitate understanding of embodiments of this application, a structure of an LINC power amplifier/transmitter that is based on a TWTA is first described with reference to FIG. 1.

Currently, two types of power amplifiers are most commonly used in the LINC power amplifier/transmitter. One type is a solid-state power amplifier (solid-state power amplifier, SSPA), mainly applicable to an application scenario with a relatively low power requirement. The other type is a TWTA, mainly applied to a case with a relatively high power requirement. Compared with the former, as an important electric vacuum power amplifier, the traveling-wave tube has a comprehensive advantage of a wide working frequency band, large output power, high efficiency, and a small volume, and has a broad application prospect in the fields of radar, electronic countermeasures, and millimeter-wave communication. For example, in an application scenario of a millimeter-wave base station, a coverage distance of the base station is greatly limited due to relatively low power of the SSPA. Therefore, a quantity of millimeter-wave base stations needs to be increased to meet a coverage requirement, causing a great increase in deployment costs. However, transmit power of the base station can be greatly improved by using the TWTA, so that a quantity of base stations can be reduced, thereby reducing deployment costs.

In addition, currently, to improve spectrum utilization, a wideband orthogonal frequency division multiplexing (OFDM) signal that is modulated based on higher-order quadrature amplitude modulation (QAM) is used for wireless communication, so that the signal has a very high peak to average power ratio (PAPR). A high-PAPR signal has a relatively high requirement for a power amplifier of the base station. Therefore, in order not to really amplify the high-PAPR signal, the power amplifier of the base station may use a power back-off method. However, this still causes very low efficiency (usually <10%). This requires the base station to use a more advanced efficient power amplifier structure, such as an LINC (or outphasing) amplifier/transmitter.

In the LINC amplifier/transmitter, first, a high-PAPR variable envelope signal is split into two constant-envelope phase-modulated signals with same signal amplitude, then, the two constant-envelope phase-modulated signals are amplified by using two efficient power amplifiers with same performance, and finally, amplified signals are combined to recover an amplified original variable envelope signal. Theoretically, the LINC amplifier/transmitter can obtain nearly 100% back-off efficiency on a basis of ensuring linearity. However, in an actual application, due to non-ideal factors in power amplifier and power combiner aspects, there are great technical challenges in design and implementation of the LINC amplifier/transmitter.

First, a single wideband non-constant-envelope modulated signal is split into two constant-envelope signals with equal amplitude and different phases by using a signal component splitter (SCS). For example, in FIG. 1, a signal S(t) is split into two signals $S_1(t)$ and $S_2(t)$. Then, power amplification is respectively performed on the two signals by using efficient TWTAs with consistent performance. Then, amplified power signals are combined by using a power combiner, to recover an amplified signal. Finally, the amplified signal is transmitted by using an antenna. Because the two signals obtained through the splitting are constant-envelope signals, the power amplifiers can work in a saturation region, thereby obtaining very high system efficiency.

However, in an actual application, due to technical limitations on a machining process, manufacturing, assembling, and the like, different TWTAs relatively greatly differ in performance. Consequently, indexes such as efficiency and linearity of an entire LINC power amplifier/transmitter system rapidly deteriorate, and a transmitter performance indicator cannot be met. Usually, a complex calibration circuit needs to be added for each power amplifier to perform calibration compensation, causing great increases in system complexity and costs.

In addition, a volume and weight of even a single TWTA are greater than those of the solid-state power amplifier. Consequently, a volume and weight of an LINC transmitter that uses two/more traveling-wave tubes are much greater than those of an LINC transmitter that uses the solid-state power amplifier.

Furthermore, to be compatible with another front-end solid-state circuit, the traveling-wave tube needs to use a same supply voltage as the solid-state circuit. The traveling-wave tube needs to work at a high voltage, and therefore cannot be used alone and needs to be used in combination with an electronic power conditioner (EPC) power supply. Therefore, a plurality of TWTAs in a plurality of systems need to use a plurality of EPC circuits. Consequently, in addition to increases in a volume and weight of an entire transmitter, a power supply network may be very complex, especially in a system such as massive-multiple-input multiple-output (massive-MIMO).

In view of this, this application provides a signal transmitter that is based on an integrated array traveling-wave tube, to effectively avoid disadvantages of a current LINC power amplifier/transmitter, thereby effectively improving performance of the LINC amplifier/transmitter.

The following describes in detail embodiments provided in this application with reference to the accompanying drawings.

Figure 2:
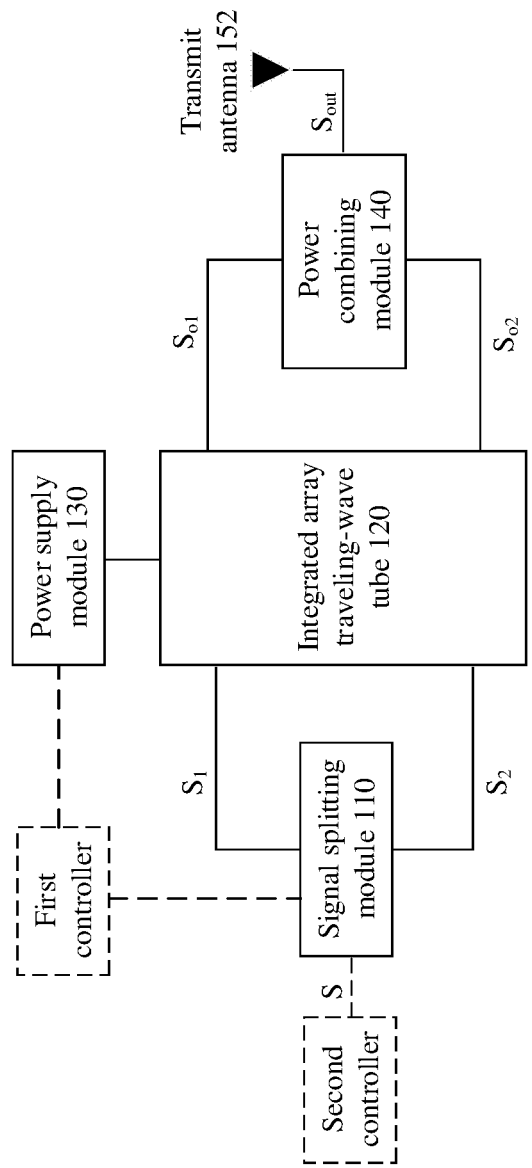
FIG. 2 is a schematic block diagram of a signal transmitter according to an embodiment of this application.

FIG. 2 shows a signal transmitter according to an embodiment of this application.

It can be learned from FIG. 2 that the signal transmitter includes a signal splitting module 110, an integrated array traveling-wave tube 120, a power supply module 130, a power combining module 140, and at least one transmit antenna 152.

The signal splitting module 110 is connected to the integrated array traveling-wave tube 120 through M (M≥2) output interfaces, and the M output interfaces one-to-one correspond to M radio frequency channels of the integrated traveling-wave tube 120. The power supply module 130 is connected to the integrated array traveling-wave tube 120 through one interface, the M radio frequency channels of the integrated array traveling-wave tube 120 are connected to the power combining module 140 through M output interfaces, and the power combining module 140 is connected to the transmit antenna 152 through one interface.

It should be understood that M signals described in this application represent two or more signals, and details are not described below again.

The following further describes functions of the modules in the signal transmitter.

(1) Signal splitting module 110: The signal splitting module 110 is configured to split a received high-PAPR wideband modulated baseband signal S into N (M≥2, N≥1, and M≥N) constant-envelope or low-PAPR sub-signals with equal amplitude and different phases, and the N sub-signals that are output by output interfaces are analog signals and reach a drive level required by the integrated array traveling-wave tube 120.

It should be understood that M represents a maximum quantity of sub-signals that can be obtained through splitting by the signal splitting module 110, and N represents a quantity of sub-signals actually obtained through splitting by the signal splitting module 110. Usually, N≥2. However, the signal transmitter in this application is also applicable to N=1. In this case, it indicates that the signal S is not split. Optionally, the signal splitting module 110 may be integrated into a baseband chip.

Optionally, the signal splitting module 110 may be implemented by using an independent dedicated signal processing circuit.

Optionally, the signal splitting module 110 may be implemented by using a special analog circuit.

Optionally, the signal splitting module 110 may provide a radio frequency modulated signal by using an existing technology, to increase signal power to the drive level required by the integrated array traveling-wave tube 120.

Optionally, when N≥2, the signal splitting module 110 may set PAPR thresholds $A_2$ to $A_N$, and determine, based on a relationship between a PAPR of the baseband signal S and the thresholds, to split the signal into two to N sub-signals. For example, when the PAPR of the baseband signal S is less than the threshold $A_2$, the signal splitting module 110 splits the baseband signal S into two sub-signals, or when the PAPR of the baseband signal S is less than the threshold $A_N$, the signal splitting module 110 splits the baseband signal S into N sub-signals.

Optionally, when N≥2, a second controller may control the signal splitting module 110 to split the signal S into the N sub-signals. The second controller may determine, in the foregoing threshold setting manner, the quantity N of sub-signals obtained by splitting the signal S. A method in which the second controller determines the quantity N is not specifically limited herein.

Optionally, the signal splitting module 110 may perform signal splitting on a plurality of wideband modulated baseband signals. Signals $S_1, \ldots,$ and $S_P$ are respectively signals of different frequency bands, and the signal splitting module 110 may respectively split the plurality of received wideband modulated baseband signals $S_1, \ldots,$ and $S_P$ (N≥P≥2) into corresponding $N_1, \ldots,$ and $N_P$ (M≥$N_1$+ . . . +$N_P$=N and $N_1, \ldots,$ and $N_P$≥1) constant-envelope or low-PAPR sub-signals with equal amplitude and different phases.

It should be understood that M represents a maximum quantity of sub-signals that can be obtained through splitting by the signal splitting module 110, and N represents a quantity of sub-signals actually obtained through splitting by the signal splitting module 110. Usually, N>P. It indicates that at least one of $S_1, \ldots,$ and $S_P$ is split into at least two sub-signals. However, the signal transmitter is also applicable to N=P. In this case, it indicates that none of $S_1, \ldots,$ and $S_P$ is split.

As an example instead of a limitation, as shown in FIG. 2, the signal S is split into two sub-signals $S_1$ and $S_2$ by using the signal splitting module, and the signals $S_1$ and $S_2$ are constant-envelope or low-PAPR sub-signals with equal amplitude and different phases.

(2) Integrated array traveling-wave tube 120: The integrated array traveling-wave tube 120 includes an electron gun component, a slow wave structure whose axis overlaps an axis of the electron gun component, a magnetic focusing system, a corresponding energy transmission apparatus, and a collector. The electron gun component is formed by arranging and combining a plurality of cathode heads and focusing electrodes corresponding to the cathode heads. The plurality of cathode heads share one cathode hot wire component for heating, and form a plurality of mutually independent electron beams under the action of respective focusing electrodes and anodes. Quantities of electron beams, cathodes, and anodes are the same as the quantity M of output interfaces of the signal splitting module 110. The slow wave structure is formed by arranging, in parallel, and combining a plurality of independent slow wave structures. The plurality of independent slow wave structures share a same magnetic focusing system and collector, and a quantity of slow wave structures is the same as the quantity M of output interfaces of the signal splitting module 110. Each slow wave structure has corresponding input and output energy transmission apparatuses, so that after each input signal is amplified, the shared collector separately recovers remaining energy of the plurality of electron beams. The plurality of electron beams emitted through the electron gun component penetrate through the plurality of independent slow wave structures under a beam stacking action of the common magnetic focusing system, and interact and exchange energy with electromagnetic waves propagating by the slow wave structures, and amplified microwave signals are output through respective energy transmission apparatuses. The collector recovers remaining electronic energy.

The integrated array traveling-wave tube 120 receives, through N of the M radio frequency channels corresponding to the M output interfaces of the signal splitting module 110, the N sub-signals obtained through splitting by the signal splitting module 110, and separately performs power amplification on the N constant-envelope/low-PAPR sub-signals obtained through the splitting, where performance consistency between the amplification channels of the N sub-signals is also ensured, and the M radio frequency channels are openable and closeable.

Optionally, the integrated array traveling-wave tube 120 may control opening and closing of the M radio frequency channels. When a quantity of sub-signals obtained by splitting a signal is N, N radio frequency channels that need to be used are opened, and unused (M−N) radio frequency channels are closed. Optionally, a first controller controls opening and closing of the M radio frequency channels of the integrated array traveling-wave tube 120, and is specifically configured to control connection and disconnection between each channel and a corresponding output interface. After determining to split the signal S into the N sub-signals, the first controller controls the N sub-signals obtained through the splitting to enter, through N of the M output interfaces of the splitting module 110, radio frequency channels that are of the integrated array traveling-wave tube 120 and that one-to-one correspond to the output interfaces, and also disconnects the other (M−N) output interfaces from corresponding radio frequency channels. For example, the signal splitting module 110 has 10 output interfaces connected to 10 radio frequency channels of the integrated array traveling-wave tube 120. If the signal splitting module 110 splits the signal S into five signals, the first controller may further control the five sub-signals to enter, through specific five of the 10 interfaces, radio frequency channels that are of the integrated array traveling-wave tube 120 and that correspond to the five interfaces, and also break direct connections between the other five output interfaces and corresponding radio frequency channels.

Optionally, the signal splitting module 110 respectively splits signals $S_1, \ldots,$ and $S_P$ (N≥P≥2) of different frequency bands into $N_1, \ldots,$ and $N_P$ (M≥$N_1$+ . . . +$N_P$=N and $N_1, \ldots,$ and $N_P$≥1) constant-envelope or low-PAPR sub-signals with equal amplitude and different phases. The integrated array traveling-wave tube 120 may design parameters such as slow wave structures and cathode voltages of different radio frequency channels, so that the different radio frequency channels support working at different frequency bands. Any $N_1$ of $M_1$ ($M_1$≥$N_1$≥1) channels support working of $N_1$ sub-signals that are in the first frequency band and that are obtained through the splitting, and any $N_2$ of $M_2$ ($M_2$≥$N_2$≥1) channels support working of $N_2$ sub-signals that are in the second frequency band and that are obtained through the splitting. Likewise, any $N_P$ of $M_P$ ($M_P$≥$N_P$) channels support working of $N_P$ sub-signals that are in the $P^{th}$ frequency band and that are obtained through the splitting. $M_1$+ . . . +$M_P$=M.

As shown in FIG. 2, after the signals $S_1$ and $S_2$ pass through the integrated array traveling-wave tube 120, amplified signals $S_{01}$ and $S_{02}$ are respectively output. Because the sub-signals $S_1$ and $S_2$ obtained through the splitting are constant-envelope signals or have PAPRs that are equal to 0 or very low, the integrated array traveling-wave tube can work in a saturation region or a near-saturation region, so that very high efficiency can be obtained.

(3) Power supply module 130: Because the integrated array traveling-wave tube is a high-voltage and low-current component, and a working voltage of the integrated array traveling-wave tube is very high and usually reaches several kilovolts or even tens of kilovolts. Such a high voltage is not compatible with an existing wireless communication system (for example, a working voltage of an existing base station system is usually only −48 V). Therefore, to enable the integrated array traveling-wave tube to be compatible with the existing system to share a same supply voltage, a power supply module 130, such as an EPC power supply system, needs to be integrated for the integrated array traveling-wave tube, to form an MMPM for use. The power supply module 130 may convert the working voltage of the existing base station system into a high voltage required by the integrated array traveling-wave tube. To ensure efficiency of the entire MMPM, the power supply module 130 needs to have very high conversion efficiency. For example, the conversion efficiency needs to be greater than 90%.

Because the integrated array traveling-wave tube substitutes for a plurality of conventional independent traveling-wave tubes, only one power supply module 130 is required to supply power to the traveling-wave tube. The power supply module 130 is connected to the integrated array traveling-wave tube 120 through one interface, and supplies respective corresponding cathode voltages to the M radio frequency channels, and further supplies a voltage to the collector shared by the M radio frequency channels.

Optionally, the first controller controls opening and closing of the M radio frequency channels of the integrated array traveling-wave tube 120, and is specifically configured to control a supply status between a cathode voltage corresponding to each radio frequency channel and the power supply module. After the signal splitting module 110 determines to split the signal S into the N sub-signals, the N sub-signals enter the N corresponding radio frequency channels through the N one-to-one corresponding output interfaces. The first controller may control the power supply module 130 to supply corresponding cathode voltages to the N radio frequency channels through which the N sub-signals pass, and also cut off cathode voltages of the other (M−N) radio frequency channels.

Optionally, the opening and closing functions of the first controller for the M radio frequency channels of the integrated array traveling-wave tube 120 may be implemented by the power supply module 130.

Optionally, a switch for controlling opening and closing of the radio frequency channel may be designed in the power supply module 130, or may be designed on a cathode of the integrated array traveling-wave tube 120. This is not specifically limited in this application.

(4) Power combining module 140: The power combining module 140 receives N sub-signals obtained through power amplification by the integrated array traveling-wave tube 120, performs power superposition on the N sub-signals obtained through the power amplification, to combine the N sub-signals obtained through the power amplification into one high-power and high-bandwidth signal, and then transmits the combined signal to the transmit antenna 152 at a back end.

As shown in FIG. 2, the power combining module 140 superposes power of the signals $S_{O1}$ and $S_{O2}$ that are obtained through power amplification by the integrated array traveling-wave tube 120, to combine the signals $S_{O1}$ and $S_{O2}$ into one signal $S_{out}$, and then sends the combined signal $S_{out}$ to the transmit antenna 152.

It should be understood that phases of the N sub-signals that are received by the power combining module 140 and that are obtained through the power amplification are different. If an isolated combiner, such as a Wilkinson combiner, is used, a very large part of power is consumed by an isolation resistor, and combining efficiency is very low. Consequently, efficiency of an entire LINC power amplifier/transmitter is very low. Therefore, currently, the LINC power amplifier/transmitter usually uses a non-isolated Chireix combiner. Therefore, an LINC power amplifier/transmitter that uses the non-isolated Chireix combiner is also often referred to as a Chireix power amplifier/transmitter.

(5) Transmit antenna 152: The transmit antenna 152 receives the signal obtained through combining by the power combining module 140, and transmits the signal to free space.

As shown in FIG. 2, the transmit antenna 152 receives the combined signal $S_{out}$ sent by the power combining module 140, and then sends the signal $S_{out}$ to another device.

Based on the foregoing technical solutions, the signal splitting module 110 or the second controller may split one or more signals into a required quantity of sub-signals, and the power supply 130 or the first controller may also control opening and closing of a plurality of channels of the integrated array traveling-wave tube 120, so that signal splitting flexibility and practicality of the transmitter is improved, and power consumption of the transmitter is also reduced by closing an unused radio frequency channel.

In addition, a plurality of independent power amplifier units in the LINC transmitter are replaced with one integrated array traveling-wave tube 120. Because the plurality of channels of the integrated array traveling-wave tube 120 use a same machining process and a same assembling method, it can be ensured that performance of the plurality of radio frequency channels of the integrated array traveling-wave tube is consistent and higher than performance of independent traveling-wave tubes. Therefore, a requirement of the LINC power amplifier/transmitter for a feedback calibration channel can be reduced to a specific degree, and even use of the feedback channel can be avoided, thereby reducing system complexity.

In addition, the integrated array traveling-wave tube 120 uses a multi-beam electron gun, and shares the magnetic focusing system and the collector, thereby effectively reducing an area occupied by a plurality of traveling-wave tube amplifiers, greatly reducing a size of the LINC power amplifier/transmitter, and reducing a volume and weight of the entire transmitter.

Furthermore, because the plurality of radio frequency channels of the integrated array traveling-wave tube 120 share the cathode hot wire component and the collector, only one EPC power supply circuit needs to be used, thereby greatly reducing power supply design difficulty and complexity of the LINC power amplifier/transmitter.

Figure 3:
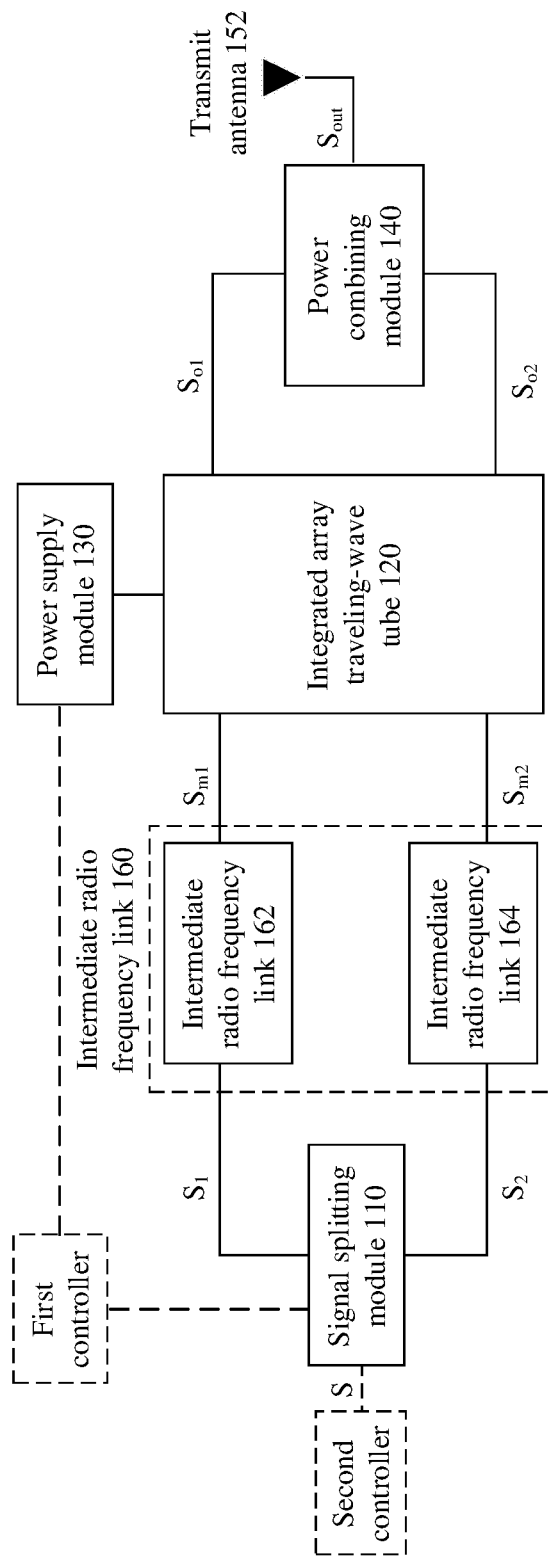
FIG. 3 is a schematic block diagram of another signal transmitter according to an embodiment of this application.

FIG. 3 shows another signal transmitter according to an embodiment of this application.

It can be learned from FIG. 3 that the signal transmitter includes a signal splitting module 110, an intermediate radio frequency link 160, an integrated array traveling-wave tube 120, a power supply module 130, a power combining module 140, and a transmit antenna 152.

The signal splitting module 110 is connected to M intermediate radio frequency links 160 through M (M≥2) output interfaces, and the M output interfaces of the signal splitting module 110 one-to-one correspond to the M intermediate radio frequency links. The intermediate radio frequency links 160 are connected to the integrated array traveling-wave tube 120 through M output interfaces, and the M output interfaces of the intermediate radio frequency links 160 one-to-one correspond to M radio frequency channels of the integrated traveling-wave tube 120. The power supply module 130 is connected to the integrated array traveling-wave tube 120 through one interface, the M radio frequency channels of the integrated array traveling-wave tube 120 are connected to the power combining module 140 through M output interfaces, and the power combining module 140 is connected to the transmit antenna 152 through one output interface.

The following further describes functions of the modules in the signal transmitter provided in this embodiment.

(1) Signal splitting module 110: The signal splitting module 110 is configured to split a received high-PAPR wideband modulated baseband signal S into N (M≥2, N≥1, and M≥N) constant-envelope or low-PAPR sub-signals with equal amplitude and different phases, and the N sub-signals that are obtained through the splitting and that are output through the output interfaces are analog signals and reach a drive level required by the integrated array traveling-wave tube 120.

It should be understood that M represents a maximum quantity of sub-signals that can be obtained through splitting by the signal splitting module 110, and N represents a quantity of sub-signals actually obtained through splitting by the signal splitting module 110. Usually, N≥2. However, the signal transmitter in this application is also applicable to N=1. In this case, it indicates that the signal S is not split.

Optionally, when N≥2, the signal splitting module 110 may set PAPR thresholds $A_2$ to $A_N$ in advance, and determine, based on a relationship between a PAPR of the baseband signal S and the thresholds, to split the signal into two to N sub-signals. For example, when the PAPR of the baseband signal S is less than the threshold $A_2$, the signal splitting module 110 splits the baseband signal S into two sub-signals, or when the PAPR of the baseband signal S is less than the threshold $A_{10}$, the signal splitting module 110 splits the baseband signal S into 10 sub-signals.

Optionally, when N≥2, a second controller may control the signal splitting module 110 to split the signal S into the N sub-signals. The second controller may determine, in the foregoing threshold setting manner, the quantity N of sub-signals obtained by splitting the signal S. A method in which the second controller determines the quantity N is not specifically limited herein.

Optionally, the signal splitting module 110 may be configured to perform signal splitting on a plurality of signals of different frequency bands. Signals $S_1, \ldots,$ and $S_P$ are respectively signals of different frequency bands, and the signal splitting module 110 may respectively split the plurality of received wideband modulated baseband signals $S_1, \ldots,$ and $S_P$ (N≥P≥2) into corresponding $N_1, \ldots,$ and $N_P$ (M≥$N_1+\ldots+N_P$=N and $N_1, \ldots,$ and $N_P$≥1) constant-envelope or low-PAPR sub-signals with equal amplitude and different phases. It should be understood that M represents a maximum quantity of sub-signals that can be obtained through splitting by the signal splitting module 110, and N represents a quantity of sub-signals actually obtained through splitting by the signal splitting module 110. Usually, N≥P. It indicates that at least one of $S_1, \ldots,$ and $S_P$ is split into at least two sub-signals. However, the signal transmitter is also applicable to N=P. In this case, it indicates that none of $S_1, \ldots,$ and $S_P$ is split.

As an example instead of a limitation, as shown in FIG. 3, the signal S is divided into two signals $S_1$ and $S_2$ by using the signal splitting module 110. An implementation in which the signal splitting module 110 splits the signal S is not specifically limited in this application.

(2) Intermediate radio frequency link 160: The intermediate radio frequency link 160 includes at least two intermediate radio frequency links 162 and 164, and a quantity of intermediate radio frequency links included in the intermediate radio frequency link 160 is the same as the quantity M of output interfaces of the signal splitting module 110. Any N intermediate radio frequency links can be configured to perform functions such as filtering, up-conversion, and amplification on the N baseband signals obtained through the splitting, so that the N sub-signals obtained through the splitting respectively obtain radio frequency constant-envelope bandwidths and power levels that are required when the N sub-signals obtained through the splitting enter the integrated array traveling-wave tube 120.

Figure 4:
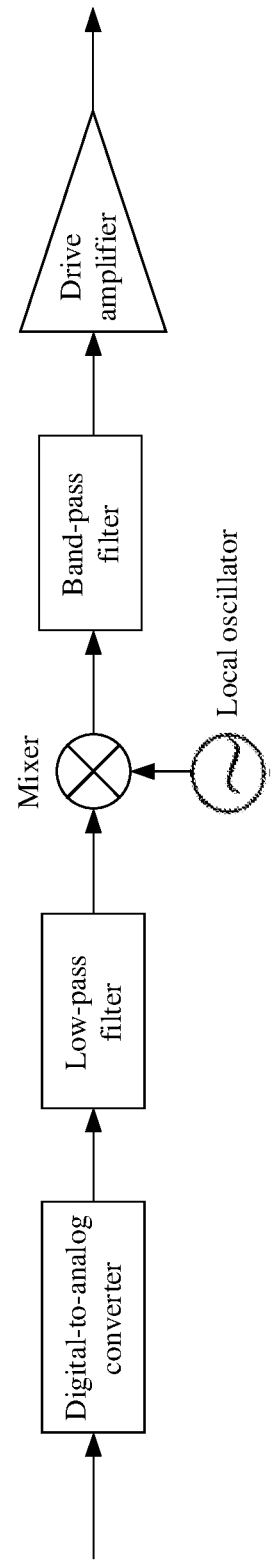
FIG. 4 is a schematic block diagram of a typical intermediate radio frequency link according to an embodiment of this application.

As an example instead of a limitation, FIG. 4 is a block diagram of a typical and common intermediate radio frequency circuit. The intermediate radio frequency circuit includes a digital-to-analog converter, a low-pass filter, a mixer, a band-pass filter, and a drive amplifier.

Optionally, the M intermediate radio frequency links include M digital-to-analog converters, and the M digital-to-analog converters one-to-one correspond to the M output interfaces of the signal splitting module 110. If the N baseband signals obtained through the splitting are digital signals, each digital-to-analog converter is configured to perform digital-to-analog conversion on a sub-signal that is output from a corresponding output interface, to convert the corresponding sub-signal from a digital signal to an analog signal, so that the analog signal can enter the integrated array traveling-wave tube 120 for power amplification.

Optionally, the M intermediate radio frequency links include M drive amplifiers, and the M drive amplifiers one-to-one correspond to the M output interfaces of the signal splitting module 110. The drive amplifier is configured to perform power amplification on a sub-signal that is output from a corresponding output interface, so that amplified power meets an input power requirement of a corresponding radio frequency channel of the integrated array traveling-wave tube 120.

For example, in FIG. 3, the intermediate radio frequency link 160 includes two intermediate radio frequency links 162 and 164. The intermediate radio frequency link 162 performs signal processing on the signal $S_1$ obtained through the splitting, to obtain a signal $S_{m1}$, and the intermediate radio frequency link 164 performs signal processing on the signal $S_2$ obtained through the splitting, to obtain a signal $S_{m2}$, so that the signal $S_{m1}$ and the signal $S_{m2}$ respectively obtain radio frequency constant-envelope bandwidths and power levels that are required when the signal $S_{m1}$ and the signal $S_{m2}$ enter the integrated array traveling-wave tube 120.

(3) Integrated array traveling-wave tube 120: For a composition structure of the integrated array traveling-wave tube 120, refer to the related descriptions in FIG. 2. Details are not described herein again.

The integrated array traveling-wave tube 120 receives, on N of the corresponding M radio frequency channels, N sub-signals obtained through processing by the intermediate radio frequency link 160, and separately performs power amplification on the processed N analog signals, where performance consistency between the amplification channels of the N sub-signals is also ensured, and the M radio frequency channels are openable and closeable.

Optionally, the integrated array traveling-wave tube 120 controls opening and closing of the M radio frequency channels. When a quantity of sub-signals obtained by splitting a signal is N, N radio frequency channels that need to be used are opened, and unused (M−N) radio frequency channels are closed.

Optionally, a first controller controls opening and closing of the M radio frequency channels of the integrated array traveling-wave tube 120, and is specifically configured to control connection and disconnection between each channel and a corresponding output interface. After determining to split the signal S into the N sub-signals, the first controller controls the N sub-signals obtained through the splitting to enter, through N of the M output interfaces of the splitting module 110, radio frequency channels that are of the integrated array traveling-wave tube 120 and that one-to-one correspond to the output interfaces, and also disconnects the other (M−N) output interfaces from corresponding radio frequency channels. For example, the signal splitting module 110 has 10 output interfaces connected to 10 radio frequency channels of the integrated array traveling-wave tube 120. If the signal splitting module 110 splits the signal S into five signals, the first controller may further control the five sub-signals to enter, through specific five of the 10 interfaces, radio frequency channels that are of the integrated array traveling-wave tube 120 and that correspond to the five interfaces, and also break direct connections between the other five output interfaces and corresponding radio frequency channels.

Optionally, the signal splitting module 110 respectively splits signals $S_1, \ldots,$ and $S_P$ ($N \geq P \geq 2$) of different frequency bands into $N_1, \ldots,$ and $N_P$ ($M \geq N_1 + \ldots + N_P = N$ and $N_1, \ldots,$ and $N_P \geq 1$) constant-envelope or low-PAPR sub-signals with equal amplitude and different phases. The integrated array traveling-wave tube 120 may design parameters such as slow wave structures and cathode voltages of different radio frequency channels, so that the different radio frequency channels support working at different frequency bands. Any $N_1$ of $M_1$ ($M_1 \geq N_1 \geq 1$) channels support working of $N_1$ sub-signals that are in the first frequency band and that are obtained through the splitting, and any $N_2$ of $M_2$ ($M_2 \geq N_2 \geq 1$) channels support working of $N_2$ sub-signals that are in the second frequency band and that are obtained through the splitting. Likewise, any $N_P$ of $M_P$ ($M_P \geq N_P$) channels support working of $N_P$ sub-signals that are in the $P^{th}$ frequency band and that are obtained through the splitting. $M_1 + \ldots + M_P = M$.

As shown in FIG. 3, after the signal $S_{m1}$ and the signal $S_{m2}$ pass through different radio frequency channels of the integrated array traveling-wave tube 120, amplified signals $S_{O1}$ and $S_{O2}$ are respectively output. Because the signal $S_{m1}$ and the signal $S_{m2}$ are constant-envelope signals or low-PAPR signals, the integrated array traveling-wave tube can work in a saturation region or a near-saturation region, so that very high efficiency can be obtained.

(4) Power supply module 130: Because the integrated array traveling-wave tube is a high-voltage and low-current component, and a working voltage of the integrated array traveling-wave tube is very high and usually reaches several kilovolts or even tens of kilovolts. Such a high voltage is not compatible with an existing wireless communication system (for example, a working voltage of an existing base station system is usually only −48 V). Therefore, to enable the integrated array traveling-wave tube to be compatible with the existing system to share a same supply voltage, a power supply module 130, such as an EPC power supply system, needs to be integrated for the integrated array traveling-wave tube, to form an MMPM for use. The power supply module 130 may convert the working voltage of the existing base station system into a high voltage required by the integrated array traveling-wave tube. To ensure efficiency of the entire MMPM, the power supply module 130 needs to have very high conversion efficiency. For example, the conversion efficiency needs to be greater than 90%.

Because the integrated array traveling-wave tube substitutes for a plurality of conventional independent traveling-wave tubes, only one power supply module 130 is required to supply power to the traveling-wave tube. The power supply module 130 is connected to the integrated array traveling-wave tube 120 through one interface, and supplies respective corresponding cathode voltages to the M radio frequency channels, and further supplies a voltage to a collector shared by the M radio frequency channels.

Optionally, the first controller controls opening and closing of the M radio frequency channels of the integrated array traveling-wave tube 120, and is specifically configured to control a supply status between a cathode voltage corresponding to each radio frequency channel and the power supply module. After the signal splitting module 110 determines to split the signal S into the N sub-signals, the N sub-signals enter the N corresponding radio frequency channels through the N one-to-one corresponding output interfaces. The first controller may control the power supply module 130 to supply corresponding cathode voltages to the N radio frequency channels through which the N sub-signals pass, and also cut off cathode voltages of the other (M−N) radio frequency channels.

Optionally, the opening and closing functions of the first controller for the M radio frequency channels of the integrated array traveling-wave tube 120 may be implemented by the power supply module 130.

Optionally, a switch for controlling opening and closing of the radio frequency channel may be designed in the power supply module 130, or may be designed on a cathode of the integrated array traveling-wave tube 120. This is not specifically limited in this application.

(5) Power combining module 140: The power combining module 140 receives N sub-signals obtained through power amplification by the integrated array traveling-wave tube 120, performs power superposition on the N sub-signals obtained through the power amplification, to combine the N sub-signals obtained through the power amplification into one high-power and high-bandwidth signal, and then transmits the combined signal to the transmit antenna 152 at a back end.

As shown in FIG. 3, the power combining module 140 superposes power of the signals $S_{O1}$ and $S_{O2}$ that are obtained through power amplification by the integrated array traveling-wave tube 120, to combine the signals $S_{O1}$ and $S_{O2}$ into one signal $S_{out}$, and then sends the combined signal $S_{out}$ to the transmit antenna 152.

It should be understood that phases of the N sub-signals that are received by the power combining module 140 and that are obtained through the power amplification are different. If an isolated combiner, such as a Wilkinson combiner, is used, a very large part of power is consumed by an isolation resistor, and combining efficiency is very low. Consequently, efficiency of an entire LINC power amplifier/transmitter is very low. Therefore, currently, the LINC power amplifier/transmitter usually uses a non-isolated Chireix combiner. Therefore, an LINC power amplifier/transmitter that uses the non-isolated Chireix combiner is also often referred to as a Chireix power amplifier/transmitter.

(6) Transmit antenna 152: The transmit antenna 152 receives the signal obtained through combining by the power combining module 140, and transmits the signal to free space.

As shown in FIG. 3, the transmit antenna 152 receives the combined signal $S_{out}$ sent by the power combining module 140, and then sends the signal $S_{out}$ to another device.

Based on the foregoing technical solutions, functions such as signal digital-to-analog conversion, signal filtering, up-conversion, and signal amplification of the N digital baseband signals obtained through the splitting may be completed through N intermediate radio frequency links, to obtain a power level required for driving the subsequent integrated array traveling-wave tube 120.

For beneficial effects caused by substituting the integrated array traveling-wave tube for two independent power amplifiers of an original LINC transmitter, refer to the descriptions in the foregoing embodiment. Details are not described herein again.

Figure 5:
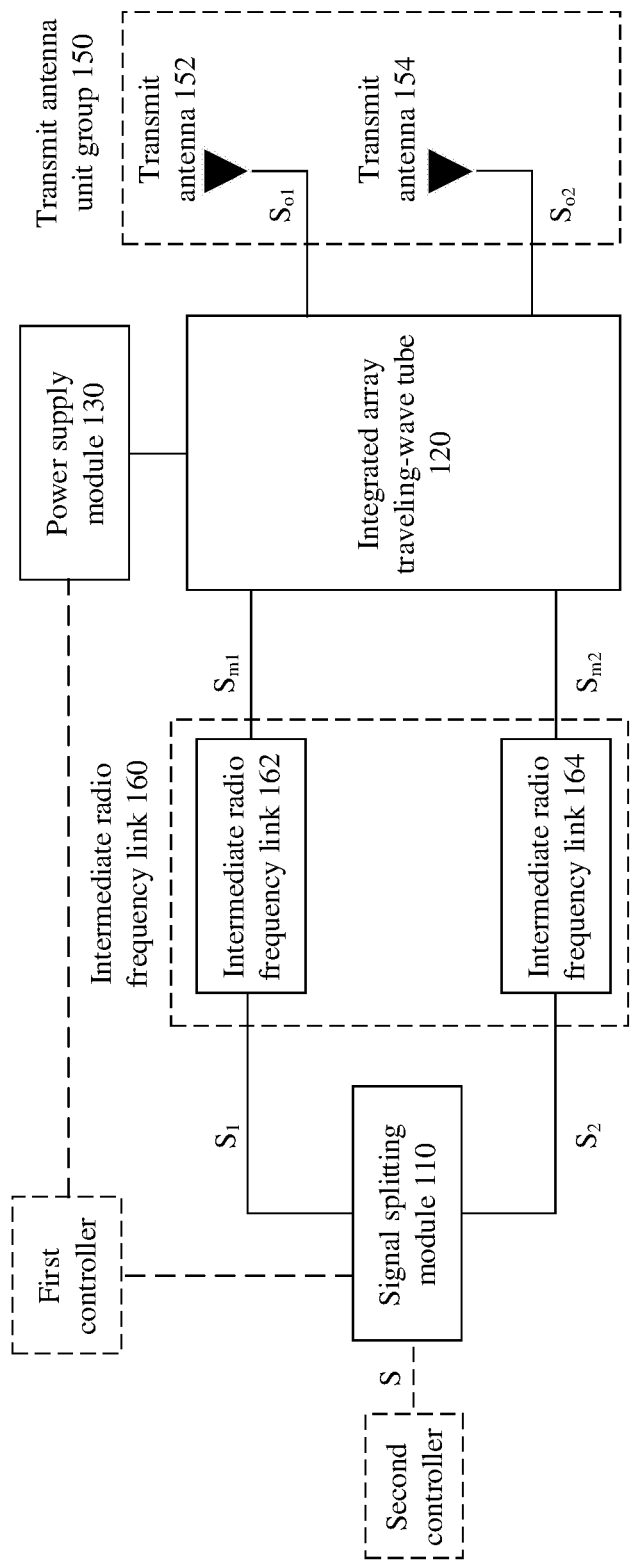
FIG. 5 is a schematic block diagram of still another signal transmitter according to an embodiment of this application.

FIG. 5 shows still another signal transmitter according to an embodiment of this application.

It can be learned from FIG. 5 that the signal transmitter includes a signal splitting module 110, an intermediate radio frequency link 160, an integrated array traveling-wave tube 120, a power supply module 130, and a transmit antenna unit group 150.

The signal splitting module 110 is connected to M intermediate radio frequency links 160 through M (M≥2) output interfaces, and the M output interfaces of the signal splitting module 110 one-to-one correspond to the M intermediate radio frequency links. The intermediate radio frequency links 160 are connected to the integrated array traveling-wave tube 120 through M output interfaces, and the M output interfaces of the intermediate radio frequency links 160 one-to-one correspond to M radio frequency channels of the integrated traveling-wave tube 120. The power supply module 130 is connected to the integrated array traveling-wave tube 120 through one interface, the M radio frequency channels of the integrated array traveling-wave tube 120 are connected to the transmit antenna unit group 150 through M output interfaces, and the M output interfaces of the integrated array traveling-wave tube 120 one-to-one correspond to M transmit antennas included in the transmit antenna unit group 150.

For descriptions of the signal splitting module 110, the integrated array traveling-wave tube 120, the power supply module 130, and the intermediate radio frequency link 160, refer to the descriptions of the modules in FIG. 3. Details are not described herein again.

Transmit antenna unit 150: The transmit antenna unit 150 includes at least two transmit antennas 152 and 154, a quantity of transmit antennas included in the transmit antenna unit 150 is the same as the quantity M of output interfaces of the signal splitting module 110, and the M transmit antennas are configured to transmit, by using one independent transmit antenna, each of N sub-signals obtained through power amplification.

After performing power amplification on sub-signals through N radio frequency channels, the signal transmitter provided in FIG. 5 no longer performs circuit-level power combining by using a Wilkinson combiner, a hybrid combiner, or the like, but directly respectively sends a plurality of sub-signals by using N transmit antennas in the transmit antenna unit group 150. To avoid channel coherence, a spacing between a plurality of transmit antennas is required to be as large as possible (usually at least 5 to 10 times a wavelength).

As shown in FIG. 5, two signals $S_{O1}$ and $S_{O2}$ obtained through amplification via two radio frequency channels of the integrated array traveling-wave tube 120 are no longer combined by using a combining module, but are directly respectively transmitted by using two antenna units 152 and 154.

In the foregoing technical solutions, a multiple-input multiple-output (MIMO) antenna structure is used, so that use of a circuit-level power combiner is avoided, and an efficiency improvement limitation of the circuit-level power combiner on an LINC power amplifier/transmitter is eliminated. Therefore, efficiency of the LINC power amplifier/transmitter can be greatly improved, and power consumption can be reduced, thereby reducing heat dissipation system requirements of the entire transmitter and a base station system, and reducing costs.

In addition, the power combiner may cause a decrease in a bandwidth after a plurality of signals obtained through power amplification are combined into one signal. Therefore, canceling the circuit-level power combiner eliminates a bandwidth limitation of the circuit-level power combiner on the transmitter, so that an architecture of the LINC power amplifier/transmitter is more suitable for use of a wideband wireless system.

An embodiment of this application further provides a communication device. The communication device may be a terminal device or a detection apparatus in which the signal transmitter in embodiments of this application is disposed, for example, a radar device. The transmitter described in the foregoing embodiments is disposed on a radar, to improve a signal transmission distance. Alternatively, the communication device may be a network device in which the signal transmitter in embodiments of this application is disposed, for example, a base station. The transmitter described in the foregoing embodiments is disposed in the base station, to improve strength and a coverage area of a base station signal.

An embodiment of this application further provides a communication system. The communication system includes the communication device in embodiments of this application. Embodiments described in this application may be independent solutions, or may be combined based on internal logic. All these solutions fall within the protection scope of this application.

A person of ordinary skill in the art may be aware that, in combination with the examples described in embodiments disclosed in this specification, units and methods may be implemented by electronic hardware or a combination of computer software and electronic hardware. Whether the functions are performed by the hardware or the software depends on particular applications and design constraints of the technical solutions. A person skilled in the art may use different methods to implement the described functions for each particular application, but it should not be considered that the implementation goes beyond the scope of this application.

It should be understood that sequence numbers of the foregoing processes do not mean execution sequences in embodiments of this application. The execution sequences of the processes should be determined based on functions and internal logic of the processes, and should not be construed as any limitation on implementation processes of embodiments of this application.

In the several embodiments provided in this application, it should be understood that the disclosed signal transmitter may be implemented in other manners. For example, the described signal transmitter embodiment is merely an example. For example, division into the units is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the signal transmitters or units may be implemented in electrical, mechanical, or other forms.

The units described as separate parts may or may not be physically separate, and parts displayed as units may or may not be physical units, may be located at one position, or may be distributed on a plurality of network units. Some or all of the units may be selected based on actual requirements to achieve the objectives of the solutions of embodiments.

In addition, functional units in embodiments of this application may be integrated into one processing unit, or each of the units may exist alone physically, or two or more units are integrated into one unit.

When the functions are implemented in a form of a software functional unit and sold or used as an independent product, the functions may be stored in a computer-readable storage medium. Based on such an understanding, the technical solutions of this application essentially, or the part contributing to the conventional technology, or some of the technical solutions may be implemented in a form of a software product. The computer software product is stored in a storage medium, and includes several instructions for instructing a computer device (which may be a personal computer, a server, a network device, or the like) to perform all or some of the steps of the methods described in embodiments of this application. The storage medium includes any medium that can store program code, such as a USB flash drive, a removable hard disk, a read-only memory (ROM), a random access memory (RAM), a magnetic disk, or an optical disc.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A signal transmitter, comprising:
    a signal splitting module, comprising M output interfaces, wherein the signal splitting module is configured to split a signal into N sub-signals, and wherein the signal splitting module is further configured to output the N sub-signals through N of the M output interfaces, wherein M and N are integers, M≥2, N≥1, and M≥N;
    an integrated array traveling-wave tube, comprising M radio frequency channels, wherein the M radio frequency channels correspond in a one-to-one relationship to the M output interfaces, wherein the integrated array traveling-wave tube is configured to amplify a sub-signal that is output from a corresponding output interface for each of the M radio frequency channels, and wherein each of the M radio frequency channels is openable and closeable;
    a power supply module, configured to supply power to the integrated array traveling-wave tube; and
    at least one transmit antenna, configured to send a signal obtained from the integrated array traveling-wave tube.

2. The signal transmitter according to claim 1, further comprising:
    a first controller, configured to control an opening and a closing of each of the M radio frequency channels.

3. The signal transmitter according to claim 2, wherein the first controller is configured to control connection and disconnection between each radio frequency channel and the corresponding output interface.

4. The signal transmitter according to claim 2, wherein:
    the power supply module is configured to supply respective corresponding cathode voltages to the M radio frequency channels; and
    the first controller is configured to control a supply status between a cathode voltage corresponding to each radio frequency channel and the power supply module.

5. The signal transmitter according to claim 2, further comprising:
    a second controller, configured to control a quantity of the N sub-signals that are output by the signal splitting module.

6. The signal transmitter according to claim 1, wherein the at least one transmit antenna comprises M transmit antennas, wherein the M transmit antennas correspond in a one-to-one relationship to the M radio frequency channels, and wherein each of the M transmit antennas is configured to send a corresponding sub-signal.

7. The signal transmitter according to claim 1, wherein the at least one transmit antenna comprises one transmit antenna, wherein the transmit antenna is configured to transmit a combined signal, and wherein the signal transmitter further comprises:
    a signal combining module, configured to combine the N sub-signals that are output from the integrated traveling-wave tube.

8. The signal transmitter according to claim 1, wherein the signal splitting module is configured to split the signal into the N sub-signals in an analog domain.

9. The signal transmitter according to claim 1, wherein the signal splitting module is configured to split the signal into the N sub-signals in a digital domain, and wherein the signal transmitter further comprises:
    M digital-to-analog converters, wherein the M digital-to-analog converters correspond in a one-to-one relationship to the M output interfaces, and wherein each of the M digital-to-analog converters is configured to perform digital-to-analog conversion on a sub-signal that is output from a corresponding output interface.

10. The signal transmitter according to claim 1, wherein the signal transmitter further comprises:
    M drive amplifiers, wherein the M drive amplifiers correspond in a one-to-one relationship to the M output interfaces, wherein the M drive amplifiers correspond in a one-to-one relationship to the M radio frequency channels, and wherein each of the M drive amplifiers is configured to amplify a sub-signal that is output from a corresponding output interface such that a power of the sub-signal meets an input power requirement of a corresponding radio frequency channel of the integrated array traveling-wave tube.

11. The signal transmitter according to claim 1, wherein the signal transmitter is disposed in a communication device.

12. The signal transmitter according to claim 11, wherein the communication device is disposed in a communication system.

* * * * *